United States Patent

Douglas et al.

Patent Number: 5,855,733
Date of Patent: Jan. 5, 1999

[54] PRESS PAD

[75] Inventors: Melvyn Douglas; Peter Boyes; John Lynn Payne, all of Rochdale, United Kingdom

[73] Assignee: Marathon Belting Limited, Rochdale, England

[21] Appl. No.: 652,540

[22] PCT Filed: Oct. 13, 1995

[86] PCT No.: PCT/GB95/02421

§ 371 Date: May 30, 1996

§ 102(e) Date: May 30, 1996

[87] PCT Pub. No.: WO96/13376

PCT Pub. Date: May 9, 1996

[30] Foreign Application Priority Data

Oct. 26, 1994 [GB] United Kingdom ............... 9421573

[51] Int. Cl.$^6$ .................. B30B 15/02; D03D 15/00
[52] U.S. Cl. .............. 156/583.1; 100/295; 139/425 R; 442/229
[58] Field of Search .................. 156/580, 583.1; 139/420 A, 420 R, 425 R; 100/295, 297; 442/228, 229, 238

[56] References Cited

U.S. PATENT DOCUMENTS

| | | | |
|---|---|---|---|
| 3,472,289 | 10/1969 | Webber et al. | 139/425 |
| 3,646,749 | 3/1972 | Clough et al. | 57/153 |
| 3,723,220 | 3/1973 | Scher et al. | 156/219 |
| 3,949,129 | 4/1976 | Hubbard | 428/190 |
| 4,922,969 | 5/1990 | Campman et al. | 139/408 |
| 5,120,597 | 6/1992 | Takimoto et al. | 428/246 |
| 5,298,322 | 3/1994 | Hennecken et al. | 428/285 |

FOREIGN PATENT DOCUMENTS

| | | | |
|---|---|---|---|
| 0235582 | 9/1987 | European Pat. Off. | B30B 15/06 |
| 0493630 | 12/1990 | European Pat. Off. | |
| 2226273 | 11/1974 | France | B29J 5/04 |
| 2239340 | 2/1975 | France | B29J 5/04 |
| DD9674 | 4/1955 | Germany | |
| 2319593 | 4/1973 | Germany | |
| 2627442 | 12/1977 | Germany | |
| 2650642 | 5/1978 | Germany | B30B 15/34 |
| 9115681 | 5/1992 | Germany | B32B 31/20 |
| 9418984 | 6/1995 | Germany | B29C 43/32 |
| 62-234696 | 10/1987 | Japan | B30B 15/02 |

OTHER PUBLICATIONS

Römp–Chemie–Lexikon, 8th Edition, 1992, vol. 5 pp. 4168–4172.

Römp–Chemie–Lexikon, 8th Edition, 1990, vol. 2, p. 1668.

Ullmans Encyklopädie der technischen Chemie, 4th Edition, 1977, vol. 13, pp. 628–631.

Ullmans Encyklopädie die technischen Chemie, 4th Ed., 1982, vol. 21, pp. 521–529.

Holleman–Wiberg, Lehrbuch der Anorganishcen Chemie, 81st–90th Ed., 1976, pp. 555–557.

*Primary Examiner*—James Sells
*Attorney, Agent, or Firm*—Harrison & Egbert

[57] ABSTRACT

A press pad for use in a laminating press comprises a woven fabric of heat resistant strands. A substantial proportion of either the warp (B) or the weft (A) comprises a silicone elastomer. Preferably, the silicone elastomer has a specific gravity within the range of 1.1 g/cm$^3$ to 1.4 g/cm$^3$ inclusive but advantageously, the silicone elastomer has a specific gravity of 1.20±0.02 g/cm$^3$. In preferred embodiments the weft (A) comprises silicone covered copper wire whilst the warp (B) comprises at least one of stainless steel wires, copper wires, copper alloy wires, copper wires wrapped with an aromatic polyamide yarn, stainless steel wires wrapped with an aromatic polyamide yarn, aromatic polyamide yarn, and polyester yarn.

14 Claims, 2 Drawing Sheets

PRESS PAD

TECHNICAL FIELD

The present invention relates to a press pad for use in a laminating press for the production of laminate sheets, such as decorative laminates and printed circuit boards, using low pressure and high pressure single daylight and multi daylight presses.

Background Art

As shown in FIG. 4 of the drawings appended hereto, in a single daylight laminating press, a laminate sheet 1 to be pressed between two platens 2 of the press is located between two metal caul plates 3 and two press pads 4. The press pads 4 are each located between one of the caul plates 3 and one of the platens 2. The press pads 4 are usually a little larger than the dimensions of the platen 2 to allow for clamping.

The purpose of the press pads 4 is to compensate for density variations in the laminate sheet 1 and thereby ensure that an equal pressure is applied to all parts of the sheet 1. In addition, the press pads 4 compensate for any unevenness in the surfaces of the platens 2 of the press itself and any flexure or bowing of the platens 2 when under pressure. Again, this assists in the production of a flat even density laminate. Thus, it is important for a press pad to be resilient and have a natural springiness to permit it to compensate for the aforementioned density variations and the surface unevenness of the press platens but also to allow it to relax after each pressing operation and recover its form to enable it to be used again. The capacity a press pad has to re-form itself after each pressing is an important characteristic to ensure a reasonable working life and to avoid unnecessary downtime of a press whilst the press pads are replaced.

However, because the purpose of the press is to apply heat to the laminate sheet whilst it is under pressure, it is important that the press pad also conducts the heat supplied by the press platens to the laminate sheet. Working temperatures for such presses are usually in a range up to 220° C.

Typically, therefore, a conventional press pad is a densely woven combination of high temperature resistant non-asbestos yarns and metal wire. The metal wire is included to give good heat transmission through the pad to the laminate sheet. In contrast, the non-metal yarn is required to give the pad the springiness and resilience required to enable the pad to relax after each pressing operation. The relative proportion of the two types of material is a consideration when devising a press pad for a particular purpose. Usually a compromise must be reached between the heat transference and the resilience required in each case.

The metal wires used are typically copper or brass wire whereas the temperature resistant yarns are usually made from aromatic polyamide fibres such as those manufactured and marketed by Du Pont Inc under the trade marks KEVLAR and NOMEX. Whilst metal wires can be woven per se, it is also common for metal strands to be wrapped around heat resistant yarns and for heat resistant yarns to be wrapped around metal strands. Metal wires may also be sheathed with textile fibres.

A conventional press pad for use in a high pressure daylight press is described in EP 0 493 630 A1. Here, the press pad is made from a woven textile of aromatic polyamide and metal threads.

Another press pad is described in EP 0 488 071 A2. This also is made from a combination of heat resistant organic fibres, such as aramide fibres, phenol fibres, polyetheretherketone fibres, and polyphenylsulfone fibres, and heat resistant inorganic fibres such as carbon fibres, glass fibres and metallic fibres.

One of the problems encountered with these conventional press pads is that in use, the metal threads eventually flatten the weave structure to such an extent that the press pad is unable to relax after each pressing operation and the pad loses its resilience and springiness.

Another problem with conventional press pads is that once a pad has been used for pressing a particular size and format of laminate sheet, it is generally not possible to use the pad again with sheets of a larger size or different format without leaving marks on the subsequently pressed sheets.

It is an object of the invention to provide a press pad which has a greater resilience and springiness over conventional pads and for a longer period without compromising the heat conduction capability of the pad. In addition, it is an object of the present invention to provide a press pad which mitigates the effect of format changes in the laminate sheets being pressed.

SUMMARY OF THE INVENTION

According to the present invention there is provided a press pad for use in a laminate press comprising a woven fabric of heat resistant strands, characterised in that a substantial proportion of at least one of the warp and the weft comprises a silicone elastomer.

The advantage of using a silicone elastomer in a press pad is that it provides a high degree of springiness and resistance to compressive loads whilst not impeding heat transference through the press pad to any greater extent than conventional materials such as aromatic polyamides. In addition, because the silicone is in itself a springy, resilient material, the springiness and resilience of the press pad is not solely dependent on its weave structure. Thus, a press pad according to the invention can be used for a longer period than a similarly woven conventional pad before losing its compensating ability. In addition, format changes in the laminate sheets being pressed can be more readily accommodated.

In addition, it is also anticipated that unlike some conventional press pads, if the silicone in the press pad is cut by metal wires which are also present in the pad, the springiness of the pad will not be significantly affected.

The silicone elastomer preferably has a specific gravity within the range of 1.1 $g/cm^3$ to 1.4 $g/cm^3$ inclusive. More particularly, however, the silicone elastomer advantageously has a specific gravity of 1.20±0.02 $g/cm^3$. Silicone elastomers within this latter range exhibit the best qualities for this application, combining the properties of a long working life, high tear strength and a good resilience to compression.

Preferably, at least one of the warp and the weft comprises silicone covered metal-wire. Alternatively, at least one of the warp and the weft comprises substantially solid silicone strands.

Preferably also, the wall thickness of the silicone of the silicone covered wire is at least 0.2 mm, and the overall outside diameter of the silicone covered wire is at least 1.0 mm.

Preferably also, the wire comprises a stranded or braided copper wire wherein the diameter of each wire strand is at least 0.05 mm.

Preferably also, the wire comprises a stranded wire made up from at least 7 wire strands.

Preferably also, the other of the warp and the weft from that which comprises the silicone elastomer, comprises strands of a copper alloy.

The present invention will now be described by way of example with reference to the accompanying drawings.

BRIEF DESCRIPTION OF THE DRAWINGS

FIGS. 1a to 3a are cross-sections of three examples of weaves for use in the manufacture of press pads according to the invention;

FIGS. 1b to 3b are weave pattern diagrams for the weaves shown in FIGS. 1a to 6a respectively.

DETAILED DESCRIPTION OF THE INVENTION

Figure 1A:
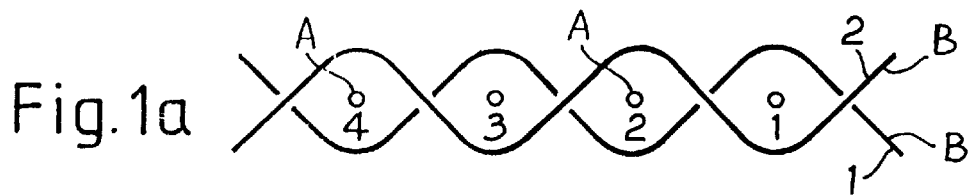

A press pad for use in a laminate press comprises a densely woven fabric which is made of materials that are heat resistant to at least 220° C. A substantial proportion of at least either the weft or the warp or both are strands comprising a silicone elastomer. The rest of the warp and weft not made of this material is made substantially of metal, either in the form of wire, which can be stranded or otherwise, or as a wrapping for a heat resistant yarn such as an aromatic polyamide yarn.

Preferably, the weft comprises a silicone covered wire, such as copper wire. For example, a suitable silicone covered wire may be a silicone covered nickel plated copper wire. However, it is also envisaged that the weft could comprise solid silicone strands.

The type of silicone elastomer used is important in order to secure the best properties for the performance of the press pad made therefrom. Silicone elastomers with a specific gravity within the range of 1.1 g/cm$^3$ to 1.4 g/cm$^3$ inclusive can be used but in order to secure the best properties wherein it is neither sufficiently springy under compression nor too brittle, the silicone elastomer preferably has a specific gravity of 1.20±0.02 g/cm$^3$ with a hardness of 70±5 IRHD. In addition it is preferably a high tear strength elastomer, for example with a minimum tear strength of 15 kN per metre and a minimum tensile strength of 6 MPa. Such a silicone elastomer is cut-resistant and capable of operating continuously at working temperatures of up to 220° C. In addition, it is capable of withstanding and recovering from pressures in the range 20 kg per cm$^2$ to 120 kg per cm$^2$ for a pressing time in the range of 15 seconds to 120 minutes as can be found in laminate presses of various types.

If silicone covered wire is used in the weft, the wall thickness of the silicone is preferably at least 0.2 mm and the overall outside diameter of the silicone covered wire is at least 1.0 mm. Stranded or braided wire can also be used wherein the wire preferably comprises at least 7 wire strands.

Such silicone covered wire can be made in a conventional manner, preferably by being extruded over either a solid metal wire or a stranded metal wire. In addition, if silicone covered copper wire is used, the copper wire can be plated to prevent oxidisation of the copper. For example, as indicated above a suitable silicone covered wire may be a silicone covered nickel plated copper wire such as is commonly used for electrical wiring. Alternatively, for the reason mentioned below, the wire may comprise stainless steel wire to overcome any problems associated with metal fatigue.

However, these problems may also be overcome by using multi-stranded copper wire which exhibits a high reversed bending strength and therefore has a lower susceptibility to metal fatigue and a greater flexibility than the conventional copper wire used for electrical wiring. Here, for example, up to 102 strands of copper wire, each of at least 0.05 mm can be covered with silicone as previously described to produce a wire of similar exterior dimensions to those previously described. Alternatively, for example, a silicone covered multi-stranded copper wire with up to 66 strands of copper wire, each of at least 0.07 could be used.

With regard to the warp strands of the pad, soft annealed copper wire is conventionally used in press pads because it is ductile and easily made into strands suitable for weaving, and it is a good heat conductor. Other metals such as aluminium, and alloys such as brass, may also be used. Whilst such metal strands can also be used in a press pad according to the present invention, it has been found that in view of the high degree of compensation present in the press pad, wherein the metal strands in the pad are repeatedly flattened out during pressing and sprung back to regain their former position by the natural springiness of the silicone elastomer after each pressing operation, the metal strands can in time exhibit the symptoms of metal fatigue. Soft annealed copper is susceptible in this regard. Hence, it is envisaged that, dependent on the particular application of the press pad, other metals which exhibit a better resistance to metal fatigue may be used either wholly or in part to form the warp strands of the pad. For example, stainless steel strands or copper alloys may be used, in particular alloys of copper with a heavy metal such as cadmium and zirconium, or with iron.

Such copper alloys wherein the proportion of the second metal is small in comparison to the whole, for example copper cadmium alloys wherein the proportion of cadmium is approximately I % of the whole, exhibit a higher reversed bending strength than soft annealed copper without significantly compromising the heat conductive properties of the metal and therefore the pad. The compensation ability of the pad is therefore ameliorated by the additional springiness of the copper alloy when compared with the relative maleability of soft annealed copper.

Non-metal strands, such as aromatic polyamide yarns or polyester yarns, may also be used to form the warp strands. In addition, metal strands such as copper or stainless steel strands may be wrapped with an aromatic polyamide yarn in a conventional manner.

Stainless steel strands may also be used to braid the exterior of silicone covered copper wire which may be used in the weft to improve its resistance to metal fatigue. Such braided strands could also be used in the warp of the weave.

It will be appreciated that although the types of strands used in the warp and in the weft have been differentiated as described above, it is possible for the warp to comprise substantially the silicone elastomer and the weft to comprise substantially metal strands or other heat resistant yarns.

Three examples of weaves suitable for use in the manufacture of a press pad will now be described with reference to the drawings. However, it will be appreciated that many other types of weave could be used.

The selection of one particular press pad over another depends largely on the type of pressing operation in which the pad is to be used. In all the given examples, the weft threads A each comprise a silicone covered stranded copper wire as is described above, which may be braided with stainless steel wire if appropriate for the application. The warp threads B preferably comprise one of stainless steel wires, copper wires, copper wires wrapped with an aromatic polyamide yarn in a conventional manner, aromatic polyamide yarn, or polyester yarn.

The weave cross-sections and the weave diagrams illustrating these examples are shown in a conventional manner. In the weave cross-sections comprising FIGS. 1a to 3a, it is the weft which is shown in cross section with the warp interweaving therebetween. In the weave diagrams comprising FIGS. 1b to 3b, the "vertical" lines represent the warp and the "horizontal" lines represent the weft; at each intersection between the warp and the weft a filled-in or crossed square indicates that the warp is placed above the weft whereas a blank square indicates that the weft is above the warp. In all cases, the weave diagrams show at least one round of weave.

EXAMPLE 1

Figure 1B:
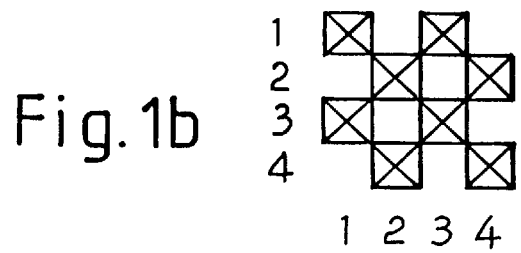

This weave is shown in FIGS. 1a and 1b and comprises a single ply plain weave. The characteristics of this weave are as follows.

| | |
|---|---|
| Number of warp threads per decimeter | 45 to 65 |
| Number of weft threads per decimeter | 30 to 47 |
| Weight of woven fabric (g/m$^2$) | 2000 to 5000 |
| Thickness of woven fabric (mm) | 1.5 to 2.5 |

EXAMPLES 2 and 3

Figure 2A:
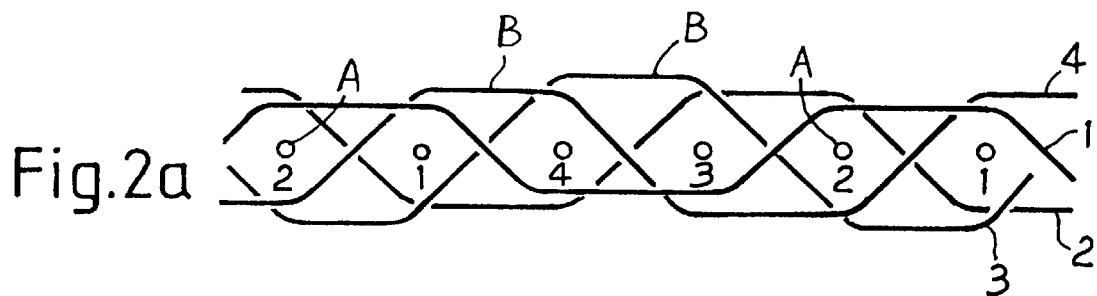
Figure 2B:
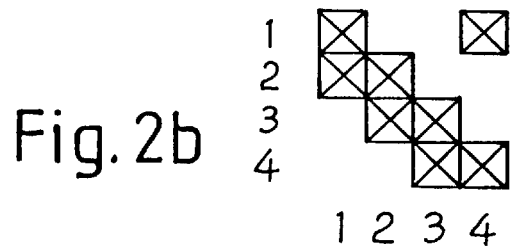
Figure 3A:
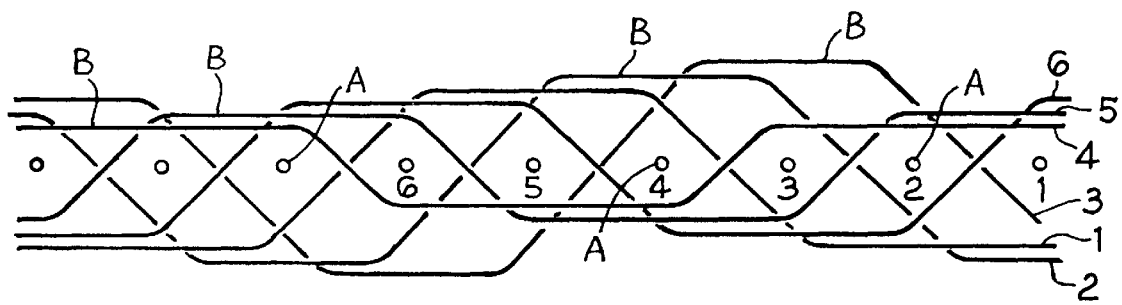
Figure 3B:
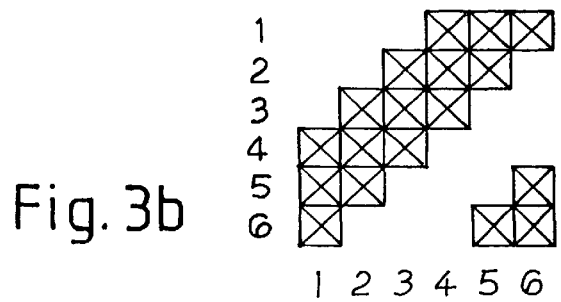
Figure 4:
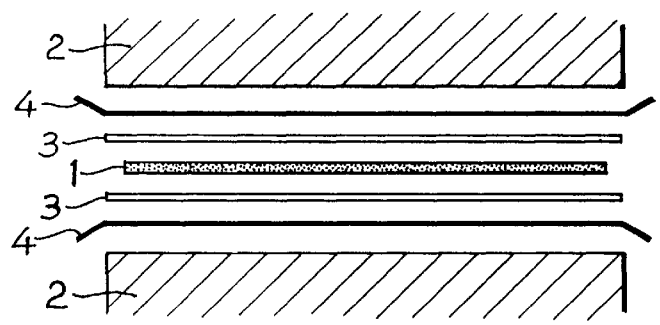
FIG. 4 is a diagram showing the conventional arrangement of a laminate sheet and press pads in a single daylight press.

Single ply simple twill weaves are shown in FIGS. 2a and 3a with their corresponding weave diagrams in FIGS. 2b and 3b. Here, the warp strands pass over and under more than one weft strand at a time. In a 2/2 twill weave, as shown in FIGS. 2a and 2b the warp threads B pass alternatively under and over two weft threads A and the woven fabric has the same amount of warp material on the both faces of the fabric, which thus presents the same appearance on both sides. Likewise, in a 3/3 twill weave, as shown in FIGS. 3a and 3b the warp strands B pass alternatively under and over three weft strands A.

Twill weaves have the advantage of providing a highly flexible press cushion with a smoother surface than other weaves. This is advantageous in some applications.

The characteristics of both the 2/2 and 3/3 twill weaves are as follows.

| | |
|---|---|
| Number of warp threads per decimeter | 60 to 75 |
| Number of weft threads per decimeter | 30 to 55 |
| Weight of woven fabric (g/m$^2$) | 2000 to 5000 |
| Thickness of woven fabric (mm) | 2.0 to 3.0 |

We claim:

1. A press pad for use in a laminate press and which can withstand pressures ranging between 20 to 120 kg per cm$^2$ inclusive and temperatures of up to 220° C. comprising:
a fabric woven of from heat resistant warp and weft strands, said strands including metal wire strands, at least one of the warp and weft strands comprises a silicone elastomer.

2. The press pad as claimed in claim 1, wherein the silicone elastomer has a specific gravity within the range of 1.1 g/cm$^3$ to 1.4 g/cm$^3$ inclusive.

3. The press pad as claimed in claim 1, wherein the silicone elastomer has a specific gravity of 1.20±0.02 g/cm$^3$.

4. The press pad as claimed in claim 2, wherein the silicone elastomer has a minimum tear strength of 15 kN per metre and a minimum tensile strength of 6 MPa.

5. The press pad as claimed in claim 1, wherein said at least one of the warp and weft strands comprises substantially solid silicone strands.

6. The press pad as claimed in claim 1, wherein said at least one of the warp and weft strands comprises silicone covered metal wire.

7. The press pad as claimed in claim 6, wherein a wall thickness of silicone of the silicone covered metal wire is at least 0.2 mm, and an overall outside diameter of the silicone covered metal wire is at least 1.0 mm.

8. The press pad as claimed in claim 6, wherein the metal wire comprises a stranded or braided copper wire wherein a diameter of each wire strand is at least 0.05 mm.

9. The press pad as claimed in claim 6, wherein the metal wire comprises a stranded wire made up from at least 7 wire strands.

10. The press pad as claimed in claim 6, wherein an exterior of the silicone covered metal wire is covered by braided stainless steel wire.

11. The press pad as claimed in claim 6, wherein the other of the warp and the weft strands, from that which comprises the silicone elastomer, comprises strands of a copper alloy.

12. The press pad as claimed in claim 11, wherein the copper alloy comprises an alloy of copper and an element selected from the group consisting of cadmium, zirconium and iron.

13. The press pad as claimed in claim 1, wherein the weft strand of said warp and weft strands comprises strands which have a silicone elastomer and wherein the warp strand of said warp and weft strands is selected from the group consisting of stainless steel wires, copper wires, copper alloy wires, copper wires wrapped with an aromatic polyamide yarn, stainless steel wires wrapped with an aromatic polyamide yarn, aromatic polyamide yarn, and polyester yarn.

14. The press pad as claimed in claim 13, wherein the weft strand of said warp and weft strands comprises silicone covered copper wire.

* * * * *